US011301601B2

(12) United States Patent
Cahoon et al.

(10) Patent No.: US 11,301,601 B2
(45) Date of Patent: Apr. 12, 2022

(54) SCENARIO DESCRIPTION LANGUAGE

(71) Applicant: Zoox, Inc., Foster City, CA (US)

(72) Inventors: Ryan Martin Cahoon, Mountain View, CA (US); Gary Linscott, Cupertino, CA (US); Adrien Treuille, San Francisco, CA (US)

(73) Assignee: Zoox, Inc., Foster City, CA (US)

( * ) Notice: Subject to any disclaimer, the term of this patent is extended or adjusted under 35 U.S.C. 154(b) by 0 days.

(21) Appl. No.: 16/657,232

(22) Filed: Oct. 18, 2019

(65) Prior Publication Data

US 2020/0050721 A1 Feb. 13, 2020

Related U.S. Application Data

(63) Continuation of application No. 15/405,649, filed on Jan. 13, 2017, now Pat. No. 10,489,529.

(Continued)

(51) Int. Cl.
*G06F 30/20* (2020.01)
*G06F 30/15* (2020.01)
(Continued)

(52) U.S. Cl.
CPC .............. *G06F 30/20* (2020.01); *G06F 30/15* (2020.01); *G09B 29/007* (2013.01); *G05D 1/0088* (2013.01)

(58) Field of Classification Search
CPC .......... G06F 30/20; G06F 30/15; G06F 30/25; G06F 30/27; G06F 30/28;
(Continued)

(56) References Cited

U.S. PATENT DOCUMENTS 8,548,198 B2 * 10/2013 Cobb .................. G06K 9/6251
382/103
8,989,945 B2 3/2015 Callow
(Continued)

FOREIGN PATENT DOCUMENTS

WO WO-2015132863 A1 * 9/2015 ............ G06F 11/261

OTHER PUBLICATIONS

Haubrich et al. "A Semantic Road Network/model for Traffic Simulations in Virtual Environments: Generation and Integration", Mar. 30, 2014, 7th Workshop on Software Engineering and Architectures, pp. 43-50. (Year: 2014).*

(Continued)

*Primary Examiner* — Kamini S Shah
*Assistant Examiner* — John E Johansen
(74) *Attorney, Agent, or Firm* — Lee & Hayes, P.C.

(57) ABSTRACT

A domain specific language, or Scenario Description Language (SDL), can be used for quickly enumerating scenarios in a simulation for testing and validating interaction of an object (e.g., an autonomous vehicle) within an environment. Scenarios in a simulation are defined using one or more primitives. Primitives are used to define objects to be instantiated (such as body size, position, orientation, velocities, etc.) and/or actions to be performed by the objects in the simulation (such as wait for a period of time, goal positions, follow a particular object, etc.). The SDL enables simple creation of multiple scenarios by combining primitives combinatorially and in some examples, limiting which scenarios are created to those that correspond to combinations that provide meaningful information. Additionally, the SDL allows for instantiation to be agnostic of map features so that a particular scenario can be instantiated automatically over all possible positions within a map.

20 Claims, 9 Drawing Sheets

Related U.S. Application Data

(60) Provisional application No. 62/408,641, filed on Oct. 14, 2016.

(51) Int. Cl.
*G05D 1/00* (2006.01)
*G09B 29/00* (2006.01)

(58) Field of Classification Search
CPC .......... G06F 2111/00–2119/22; G05D 1/0088; G09B 29/007
USPC .......................................................... 703/13
See application file for complete search history.

(56) References Cited

U.S. PATENT DOCUMENTS

| | | | |
|---|---|---|---|
| 9,459,840 B1* | 10/2016 | Yu | G06F 8/20 |
| 9,511,767 B1 | 12/2016 | Okumura et al. | |
| 9,645,577 B1 | 5/2017 | Frazzoli et al. | |
| 9,740,944 B2 | 8/2017 | Micks et al. | |
| 10,248,124 B2* | 4/2019 | Bellaiche | G06T 7/74 |
| 2016/0210382 A1* | 7/2016 | Alaniz | G09B 19/167 |
| 2017/0076019 A1 | 3/2017 | Nallapa et al. | |
| 2017/0109928 A1 | 4/2017 | Micks et al. | |
| 2017/0115396 A1 | 4/2017 | Uehara | |
| 2018/0107770 A1 | 4/2018 | Cahoon et al. | |
| 2018/0203445 A1 | 7/2018 | Micks et al. | |
| 2018/0267538 A1 | 9/2018 | Shum et al. | |
| 2020/0320233 A1* | 10/2020 | Naderhirn | G06F 30/00 |
| 2021/0132613 A1 | 5/2021 | Askeland et al. | |

OTHER PUBLICATIONS

Zurada et al. "Pertubation method for deleting redundant inputs of perceptron networks", 1997, Neurocomputing 14, pp. 177-193. (Year: 1997).*

O'Kelly et al. "APEX: Autonomous Vehicle Plan Verification and Execution", Apr. 14, 2016, Real-Time and Embedded Systems Lab, 14 pages. (Year: 2016).*

Hulsen et al. "Traffic Intersection Situation Description Ontology for Advanced Driver Assistance", Jun. 9, 2011, IEEE Intelligent Vehicles Symposium (IV), pp. 993-999. (Year: 2011).*

Roth, Jörg. "Accessing location data in mobile environments—the nimbus location model." Workshop on Mobile and Ubiquitous Information Access. Springer, Berlin, Heidelberg, 2003. P. 256-270. (Year: 2003).*

Rasmussen, Christopher. "Road shape classification for detecting and negotiating intersections." IEEE IV2003 Intelligent Vehicles Symposium. Proceedings (Cat. No. 03TH8683). IEEE, 2003. p. 422-427. (Year: 2003).*

Rago, Alejandro, Claudia Marcos, and J. Andres Diaz-Pace. "Identifying duplicate functionality in textual use cases by aligning semantic actions." Software & Systems Modeling 15.2 (2016): [Published online 2014] pp. 579-603. (Year: 2014).*

Sippl, Christoph, et al. "From simulation data to test cases for fully automated driving and ADAS." IFIP International Conference on Testing Software and Systems. Springer, Cham, 2016. [Original publication pp. 191-206], pp. 1-20. (Year: 2016).*

Haubrich,, et al. "Integration of Road Network Logics into Virtual Environments", Mar. 2014, <<https://www.researchgate.com/publication/261365483>>, 11pages.

O'Kelly, "APEX, Autonomous Vehicle Plan Verification and Execution", SAE Technical Paper Series, Apr. 14, 2016, pp. 1-12.

Office action for U.S. Appl. No. 15/405,649, dated Jan. 11, 2019, Cahoon, "Scenario Description Language", 11 pages.

Office Action for U.S. Appl. No. 15/694,097, dated May 16, 2019, Askeland, "Onboard Use of Scenario Description Language", 13 pages.

Paielli, Russell A. "Automated Generation of Air Traffic Encounters forTesting Conflict-Resolution Software", Journal of Aerospace Information Systems, vol. 10, No. 5, May 2013, pp. 209-217.

PCT Search Report and Written Opinion dated Jan. 15, 2018 for PCT applicaiton No. PCT/US2017/056398, 18 pages.

Sippl, et al., "From Simulation Data to Test Cases for Fully Automated Driving and ADAS", Testing Software and Systems, ICTSS 2016, Lecture Notes in Computer Science, vol. 9976, No. 558, Oct. 4, 2016, pp. 191-206.

Wood, et. al., "Representation theory and invariant neural networks" Discreet Applied Mathematics 69, 1996, pp. 33-60.

Zurada, et.al, "Perturbation method for deleting redundant inputs of perceptron networks", Neurocomputing 14, 1997, pp. 177-193.

Office Action for U.S. Appl. No. 15/694,097, dated Oct. 31, 2019, Askeland, "Onboard Use of Scenario Description Language", 16 pages.

Non Final Office Action dated Mar. 26, 2020 for U.S. Appl. No. 15/694,097 "Onboard Use of Scenario Description Language" Askeland, 17 pages.

European Office Action dated Dec. 17, 2020 for European Patent Application No. 17792243.2, a counterpart foreign application of U.S. Pat. No. 10,489,529, 4 pages.

Office Action for U.S. Appl. No. 16/657,232, dated May 13, 2021, Cahoon, "Scenario Description Language", 44 pages.

* cited by examiner

SCENARIO DESCRIPTION LANGUAGE

PRIORITY APPLICATION

This application is a Continuation of and claims priority to U.S. patent application Ser. No. 15/405,649, filed on Jan. 13, 2019, which claims the benefit of U.S. Provisional Application No. 62/408,641, filed on Oct. 14, 2016, the entire contents of which are incorporated herein by reference.

BACKGROUND

An interaction of objects with one another in an environment given specified starting conditions, can generally be referred to as a scenario. Various parameters of a system, such as robustness, can be categorized based on outcomes (i.e., the end result) of the scenarios given input from the system. Often, physical testing or validation of a particular scenario is neither viable nor possible. For sufficiently simple scenarios, it can be possible to obtain analytical solutions for testing or validation purposes, incorporating physical approximations where necessary. However, where situations become too complex, analytical solutions may not be viable. In such situations, testing and validation is done through the use of simulations.

As one example, simulations have been used to test operating software for autonomous vehicles. Simulation is required because it is impossible to safely test the software among traffic and pedestrians. Additionally, it is virtually impossible to repeat such tests using exactly the same conditions. For example, it would be nearly impossible to precisely recreate a situation in which an autonomous vehicle avoids a drunk driver on a highway over and over due to both safety concerns and repeatability. Moreover, physical testing also presents the limitation of the practicable number of scenarios which can be tested (e.g., it may not be feasible to test some result millions of times). These simulations, therefore, attempt to recreate the world, and obstacles within it, so as to accurately reproduce scenarios which can be encountered by an autonomous vehicle.

BRIEF DESCRIPTION OF THE DRAWINGS

The techniques described herein will now be described, by way of example, with reference to the accompanying drawings, where like numerals denote like elements and in which.

DETAILED DESCRIPTION

Figure 1:
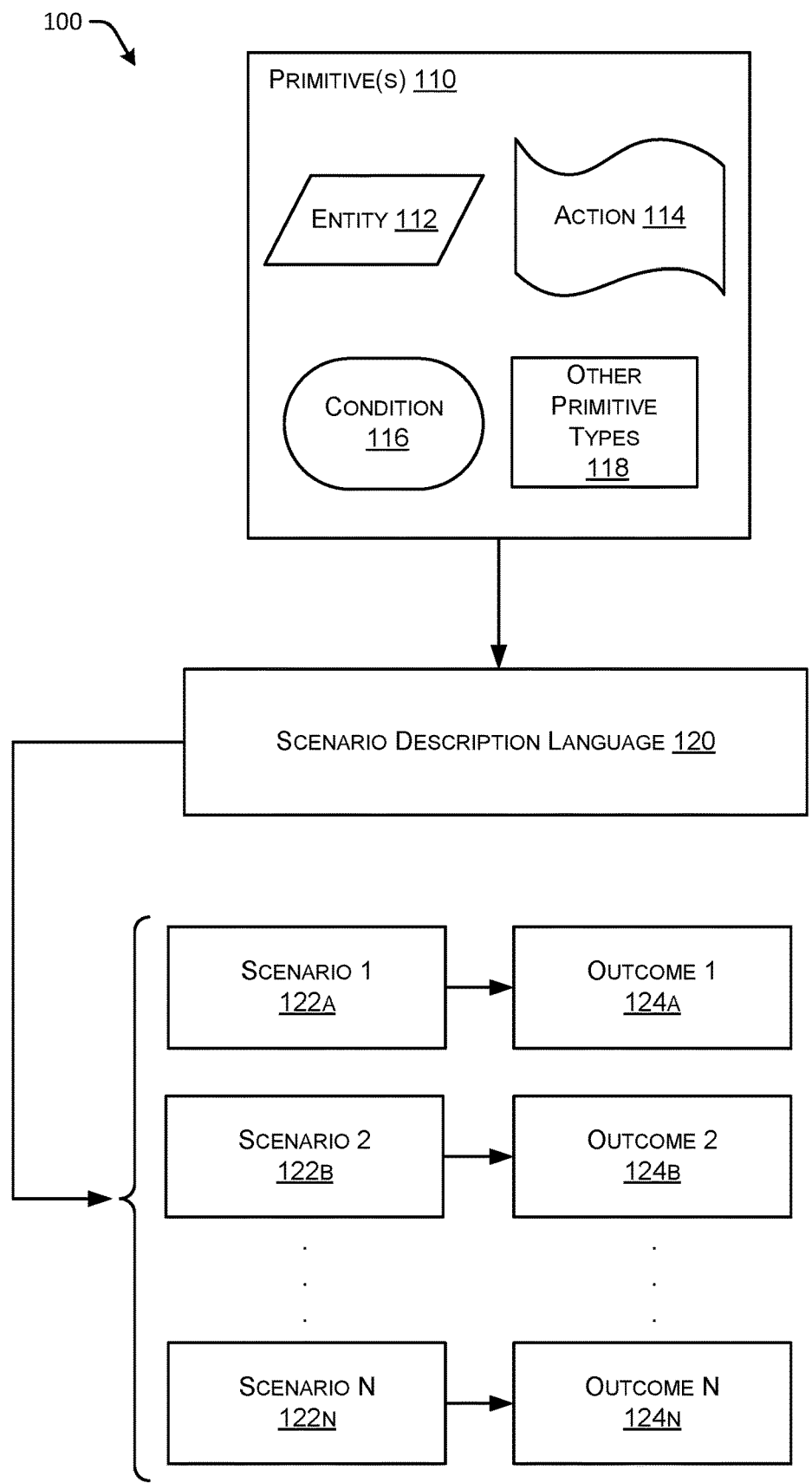
FIG. 1 illustrates an example of a block diagram illustrating how scenarios are defined using the scenario description language.

The following detailed description is directed to techniques for creating a domain specific language for use in constructing simulations. Though the technologies described can be generally applicable to various simulation environments, for the purpose of brevity, the detailed discussion is directed to examples involving vehicles. As described above, many industries use simulation environments for testing and validation. As a non-limiting example, simulations can be used to validate software (i.e., an autonomous controller) being run on autonomous vehicles to ensure that the software is able to safely control such autonomous vehicles. In additional and/or alternative examples, simulations can be used to learn about the constraints of autonomous vehicles running based on the software. For instance, simulations can be used to understand the operational space of an autonomous vehicle (i.e. the envelope of parameters in which the autonomous controller effectively controls the autonomous vehicle) in view of surface conditions, ambient noise, faulty components, etc. Simulations can also be useful for generating feedback for improving operations and designs of autonomous vehicles. For instance, in some examples, simulations can be useful for determining an amount of redundancy that is required in an autonomous controller, or how to modify a behavior of the autonomous controller based on what is learned through simulations. Furthermore, in additional and/or alternative examples, simulations can be useful to inform the hardware design of autonomous vehicles, such as optimizing placement of sensors on an autonomous vehicle.

When creating a simulation environment to perform testing and validation, it is possible to specifically enumerate the environment with various and specific examples. Each instantiation of such an environment can be unique and defined. Enumerating all possible scenarios manually can require inordinate amounts of time and, if not every possible scenario is constructed, various scenarios can go untested. Additionally, even though multiple scenarios can be described, there is no guarantee that the additional scenarios provide any additional, useful, information. For example, incremental differences in starting positions of simulated vehicles at an intersection can only provide marginal, if any, additional useful information about the ability of an autonomous vehicle to respond in the scenario given a particular set of computer code.

Techniques described herein are directed to a domain specific language which enables a user to concisely describe, at a high level, scenarios that are to be simulated. The domain specific language can be executable by a computing system to instantiate scenarios in a simulation environment. In one example, the domain specific language can be used to define outcomes of the scenario that are useful so that scenarios that are unlikely to be useful can be filtered out. In this way, the domain specific language can be used to determine a limited number of scenarios to simulate which will provide useful information. The scenarios determined to provide useful information can then be instantiated in the simulation environment. Such a domain specific language reduces computational complexity, memory requirements, and processing time by optimizing over specific scenarios which provide useful information for validation and testing.

In at least one example, a simulation environment can be constructed through the use of primitives which interact with an environment, such as a map. Primitives can include, but are not limited to, entities (which can be either static or dynamic), entity behaviors, actions, conditions, noises, faults, etc. In at least one example, a scenario can include one or more primitives that interact with a map. In some examples, entities can be associated with a coordinate system (e.g., a two-dimensional or three-dimensional coordinate system), such as an inertial coordinate system, a track based coordinate system, a map based coordinate system, or the like, in which a position and/or velocity of an entity can be described. Such scenarios can be enumerated in a Scenario Definition Format (SDF). Additionally, as will be discussed in detail below, primitives can be connected via linear temporal logic. As a non-limiting example, one scenario can be defined as one entity, a car for example, having certain dimensions and velocity, positioned to be a predetermined distance ahead of a simulated test autonomous vehicle, also having specified dimensions and velocity, along a roadway.

As described above, the SDF is capable of enumerating an infinite number of scenarios. However, many of the scenarios that can be created are either non-physical or provide marginal information returns as compared with other scenarios. For example, naively using primitives to create a scenario can lead to scenarios in which primitive entities intersect one another. Such a scenario would be non-physical. Additionally, as described above, incremental changes in starting positions of the above scenario may not provide useful data as compared to other scenarios.

As described in detail below, the domain specific language can be used to specify scenarios at a high level, so that multiple scenarios can be easily instantiated using few commands. Accordingly, the multiple scenarios are able to exhaustively, and efficiently, explore a parameter space associated with an environment. In at least one example, this can be accomplished by "templating" scenarios, so that only the differences between scenario instantiations need to be specified. Through the use of the domain specific language for creating scenarios, or Scenario Description Language (SDL), primitive scenarios can be easily enumerated such that scenarios which provide useful are instantiated. In at least one example, the SDL is a domain specific language that allows the specification of primitives in an environment using a set of high-level definitions. In some examples, the SDL is capable of combinatorially combining the primitives in a user defined manner. In one example, use of the SDL provides a set of feasible and interesting scenarios to be tested via simulation.

As described above, primitives can be instantiated within an environment, such as within a map. In at least one example, the SDL allows for instantiation automatically on a map at a location that can be expressed in a manner independent of map coordinates, for instance, by instantiating primitives relative to map topologies, or "semantic coordinates." As a non-limiting example, the SDL allows a user to specify that instantiation of a primitive is to be at a T-intersection (as opposed to requiring a user to input a specific two- or three-dimensional coordinate). By defining high level scenarios using map topologies, a user need not know anything about a map. Additionally, by defining instantiation relative to an intersection type, for example, all intersections of the given type can be substantially simultaneously instantiated with similar primitives. Using the SDL, it is possible to have concise definitions of test scenarios, which allows computer code to be highly readable and allows for quick updates of a large suite of test scenarios whenever map data is updated. As such, the SDL enables running an "exhaustive enumerative" search over conditions, as well as enabling a user to run tests often as they develop a system. Additionally, memory and processing requirements are reduced by limiting iterations by iterating over scenarios which provide useful information. More details are provided below with reference to FIGS. 1-8.

Primitives

As described above, the SDL allows for easily defining scenarios at a high level to be constructed based on a set of primitives. In at least one example, primitives can be instantiated within an environment, such as within a map. Maps can be two dimensional or three dimensional. Two- and/or three-dimensional maps can be any number of data structures capable of providing information about an environment, such as, but not limited to, topologies (such as intersections), streets, mountain ranges, roads, terrain, and the environment in general. For the purpose of this discussion, a primitive defines a specific aspect of a simulation environment. Non-limiting examples of primitives include coordinate systems, conditions, actions, entities, entity behaviors, noises, faults, etc.

Coordinate systems can be utilized to describe positions and/or speeds (or velocities) of entities in a scenario. Coordinate systems can include inertial coordinate systems, track based coordinate systems, map based coordinate systems, or the like. An inertial coordinate system can be a coordinate system relative to some local or global coordinate system. A track based coordinate system can be a coordinate system relative to some position on a track, such as a segment of a road. A map based coordinate system can utilize semantic coordinates, as described above.

In at least one example, various primitives can provide instructions to a simulation application executable on a computing system. The simulation application, described below, can be referred to herein as a "simulator."

In at least one example, a condition primitive can cause the performance of some action or evaluation of some other condition to be delayed until a condition associated with the condition primitive is satisfied. Condition primitives can include, but are not limited to, a "wait" condition, a "wait for" condition, a "distance between or near" condition, a "speed" condition, an "in region" condition, etc. Additionally and/or alternatively, an "inversion modifier" condition can invert a condition. Conditions can also include Boolean operators, such as, but not limited to, and, or not, xor, nor, nand, etc, such that multiple conditions as primitives can be combined. It should be noted that the names of the conditions described below are non-limiting and conditions can be called by same or different names in additional and/or alternative examples.

A "wait" condition can instruct the simulator to delay the performance of some action or evaluation of some other condition a specified period of time before proceeding. That is, a "wait" condition can be satisfied upon lapse of the period of time. A "wait for" condition can instruct the simulator not to take any action until another condition is met. That is, a "wait for" condition can be satisfied upon the satisfaction of another condition.

A "distance between or near" condition can instruct the simulator to delay the performance of some action or evaluation of some other condition until the distance between two entities is below some user specified value. That is, a "distance between or near condition" can be satisfied when a distance between specified entities is determined to be within a threshold distance. In at least one example, when a distance between specified entities is within a threshold distance, a Boolean signaling can be relayed to the simulator indicating that the distance between two entities is below some user specified value.

A "speed" condition can instruct the simulator to delay the performance of some action or evaluation of some other condition until a speed (or velocity) of an entity is less than (or greater than) a specified value, or reaches a specified value. That is, a "speed" condition can be satisfied when the speed (or velocity) of an entity is less than (or greater than) a specified value, or reaches a specified value. In at least one example, when the speed (or velocity) of an entity is less than (or greater than) a specified value, or reaches a specified value, a Boolean signaling can be relayed to the simulator indicating that a speed (or velocity) of an entity is less than (or greater than) a specified value, or reaches a specified value.

An "in region" condition can instruct the simulator to delay the performance of some action or evaluation of some other condition until an entity is within a specified region. That is, an "in region" condition can be satisfied based on at least a portion of an entity being within a volume of space in a scene (e.g., environment) corresponding to a specified region. In at least one example, based on at least a portion of an entity being within a volume of space in a scene (e.g., environment) corresponding to a specified region, a Boolean signaling can be relayed to the simulator indicating that an entity is within the specified region.

In at least one example, actions corresponding to action primitives can be performed by the simulator when they are encountered during instantiation of a sequence. Actions can include turning a trigger on or off. Furthermore, actions can include identifying success or failure, for instance, at the end of a test. In at least one example, an action can include generating a Log(Display) message for providing the message to a display associated with the simulator when invoked. Moreover, actions can include creating and/or destroying entities and/or changing entities (e.g., size, shape, type, etc.). In at least one example, an action can include facilitating tele-operation action (i.e., signaling a command from a virtual operator).

In at least one example, entity primitives can correspond to entities in a scene. An example of an entity can include a car, a pedestrian, a bike, a building, etc. Each entity can be associated with given dimensions, a type, a pose, and a mesh to render as the entity in the simulated environment. Dimensions can correspond to length, width, and height of an entity. A type of an entity can indicate whether the entity is static (not moving) or dynamic (moving). Examples of static entities can include buildings. Examples of dynamic entities can include cars, pedestrians, bikes, etc.

A pose associated with an entity primitive can indicate a location and/or orientation of the corresponding entity in a coordinate system (e.g., inertial coordinate system, track based coordinate system, map based coordinate system, etc.). For instance, a pose of an entity can be described in a two dimensional inertial coordinate system using a coordinate (x, y) and angular offset (yaw). Similarly, a pose of an entity in a three dimensional coordinate system can be described by a coordinate (x, y, z), as well as an orientation (roll, pitch, yaw). Or, a pose of an entity can be described in a track based coordinate system with the coordinates (s, t, [yaw_offset]), wherein 's' is an offset along a trajectory of a track, 't' is the offset perpendicular to the trajectory of the track, and yaw_offset is relative to a direction of travel along the track. In a map based coordinate system, a pose can be defined by semantic coordinates. Semantic coordinates can correspond to poses of entities relative to other known poses.

Entity behavior primitives can indicate how an entity behaves in the environment. Entity behavior primitives can include, but are not limited to, a "stop" behavior, a "move" behavior, a "follow road" behavior, a "cross road" behavior, a "follow entity" behavior, etc. A "stop" behavior can indicate to the simulator to stop moving an entity. A "move" behavior can indicate to the simulator to move an entity based on inertial coordinates. In some examples, a "move" behavior can be associated with a speed (or velocity). A "follow road" behavior can indicate to the simulator to continue moving an entity along a road in a map. In some examples, a "follow road" behavior can indicate to the simulator how to navigate an entity if the entity approaches an intersection (i.e., which branch to take). In some examples, a "follow road" behavior can be associated with a speed (or velocity). A "cross road" behavior can indicate to the simulator to move an entity laterally across a road in a map. In some examples, the "cross road" behavior can be associated with a speed (or velocity). A "follow entity" behavior can indicate to the simulator that a first entity should be moved so as to follow a second entity. In at least one example, the "follow entity" behavior can be associated with a speed (or velocity) and an offset value, which is a distance between the first object and the second object.

It should be noted that the names of the entity behaviors described above are non-limiting and entity behaviors can be called by same or different names in additional and/or alternative examples. Furthermore, in alternative examples, an entity behavior can be mapped to, or otherwise associated with, an entity primitive instead of being its own primitive.

Noises can represent Gaussian noise or other occlusions in an environment. That is, noise primitives can indicate to the simulator to cause a particular noise to be present in the simulated environment.

Faults can represent failures associated with an entity and/or environment. For instance, as non-limiting examples, a fault can represent a failure of a sensor associated with an entity, a failure of a tire associated with an entity, or a failure of another component associated with an entity. Fault primitives can indicate to the simulator to cause a respective fault in the simulated environment.

While the aforementioned paragraphs describe non-limiting examples of primitives including coordinate systems, conditions, actions, entities, entity behaviors, noises, faults, etc., it should be noted that additional and/or alternative primitives can be used to generate scenarios as described herein.

Scenario Description Language

FIG. 1 is a block diagram 100 broadly illustrating how scenarios are generated with the SDL, in one example. As shown, primitives 110 can include entities 112, actions 114, conditions 116, and any other primitive type 118 (e.g., entity behaviors, noises, faults, etc.). A scenario can be defined at a high level using the scenario description language 120. The scenario description language 120 allows for easily creating scenarios based on the aforementioned primitives 110. The scenario description language 120 allows a user to define specifics about one or more primitives 110. For example, a user can define an entity 112 having a certain dimension, a pose (e.g., using track coordinates, inertial coordinates, or semantic coordinates), as well as specify certain speeds (or velocities) of entities by assigning an entity behavior to the entity 112. In at least one example, at least one primitive can be designated as an "autonomous vehicle" and can be associated with an autonomous controller such that output of a simulation validates a behavior of an autonomous vehicle that would be controlled by such an autonomous controller.

Additionally, the scenario description language 120 allows the user to specify how certain primitives are associated with one another, for example, using a linear temporal logic. In one example, a user defines an association between primitives by specifying a sequence. A sequence can include multiple steps, which are to be performed in sequential order by the simulator. In at least one example, sequences can be nested within one another such that one step in a sequence is another sequence. As a non-limiting example, a sequence can comprise a "wait for" condition, followed by a "wait" condition, followed by a "follow" behavior.

The scenario description language 120 can create one or more scenarios 122a-122n using the primitives 110, combined in a manner as defined by a user. The manner in which the primitives 110 are combined for each scenario 122a-122n can be defined by linear temporal logic, as described above. In at least one example, each scenario 122a-122n can be associated with an outcome, such as outcome 124a-124n. An outcome can indicate how an autonomous controller is to respond given the scenario created in the simulation environment. Each of the outcomes can be used to determine whether an autonomous controller responds consistent with the outcome (e.g., successfully) or inconsistent with the outcome (e.g., unsuccessfully) given the scenario created in the simulation environment.

At a high level, each of the scenarios 122a-122n can be run in simulation substantially simultaneously and/or in parallel using a processor (e.g., graphics processing unit (GPU), etc.), using multiple computers running such a simulation, or a combination thereof. As such, many outcomes can be generated substantially simultaneously.

Figure 2:
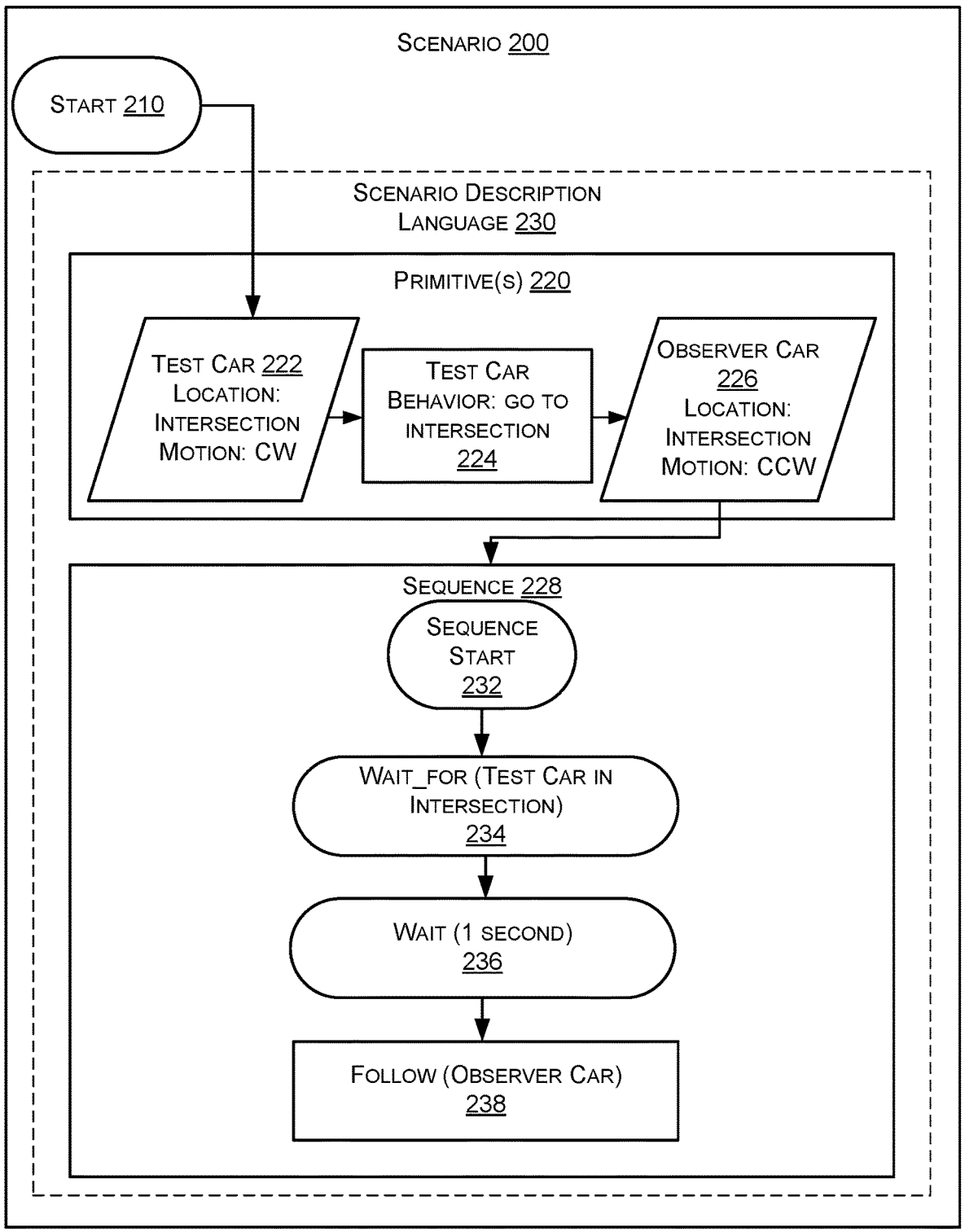
FIG. 2 depicts an example scenario which can be created using the scenario description language.

FIG. 2 illustrates a block diagram of an example scenario 200 that can be created by a user. Example scenario 200 can correspond to any one of the scenarios 122a-122n, described above with reference to FIG. 1. Though a start position 210 is depicted in FIG. 2, such a start position 210 need not be defined. At the beginning of the scenario 200, a user can specify and define one or more primitives 220 to be instantiated by a simulator. That is, a user can provide instructions defining the primitive(s) 220 in the scenario. In the example illustrated in FIG. 2, such primitives include a test car 222 and an observer car 226. The test car 222 can be defined as having a size, position relative to an intersection, a speed (or velocity), a direction of motion (clockwise (CW)), etc. Test car 222 can be associated with a behavior ("move to intersection"), which is represented as primitive 224. The observer car 226 can also be defined as having a size, position relative to an intersection, a speed (or velocity), a direction of motion (counterclockwise (CCW)), etc. Though depicted as a series of connections, primitives 220 can be instantiated in any order, or instantiated substantially simultaneously.

As further illustrated, once instantiated, the simulator can be instructed to perform a sequence 228. As described above, a sequence 228 can define an association between primitive(s) 220 using linear temporal logic. The primitive(s) 220 and the sequence 228 can be defined by the scenario description language 230, which can correspond to the scenario description language 120, described above with reference to FIG. 1. Sequence 228 can optionally have a sequence start 232. Such a sequence start 232 can indicate to a simulator that a sequence 228 is about to start. In a non-limiting example, the sequence 228 can be defined as a "wait for" condition 234, a "wait" condition 236, and a "follow entity" behavior 238. Instructions associated with such a sequence 228 instructs the simulator to first wait for the test car 222 to approach the intersection, wait 1 second, and then have the test car 222 follow the observer car 226.

Figure 3:
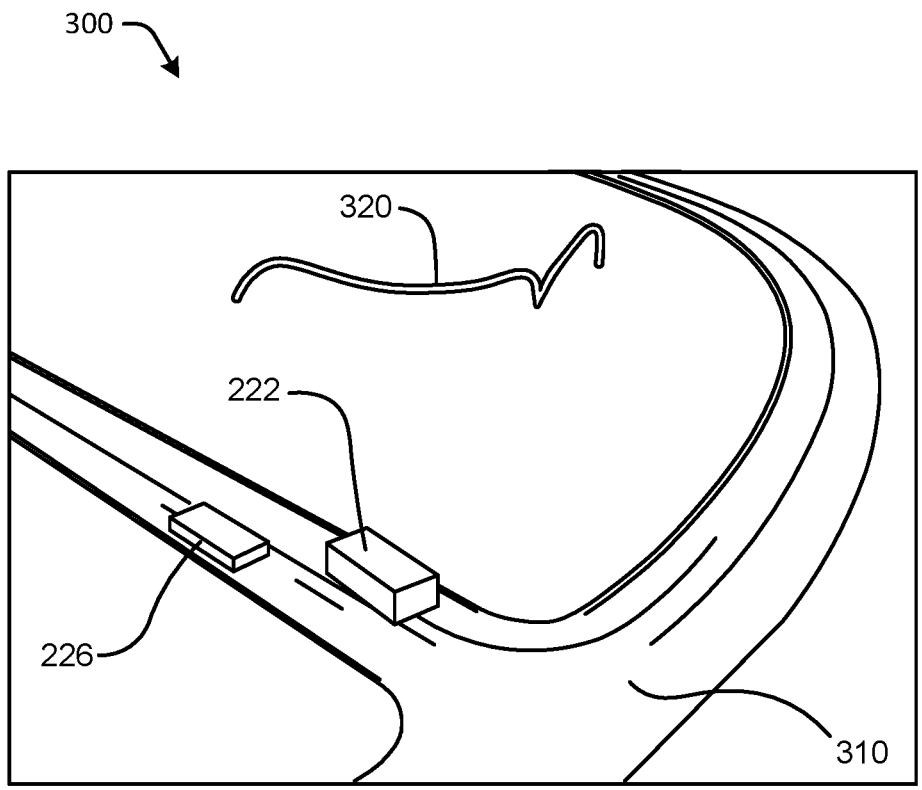
FIG. 3 illustrates an example rendered scenario.
Figure 4A:
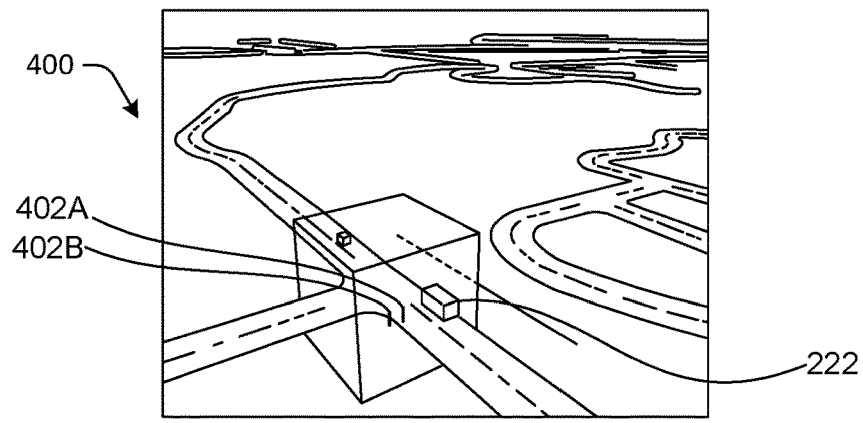
FIG. 4A shows a first example scenario of many scenarios created by combinatorially combining primitives as defined by a user using the scenario description language.
Figure 4B:
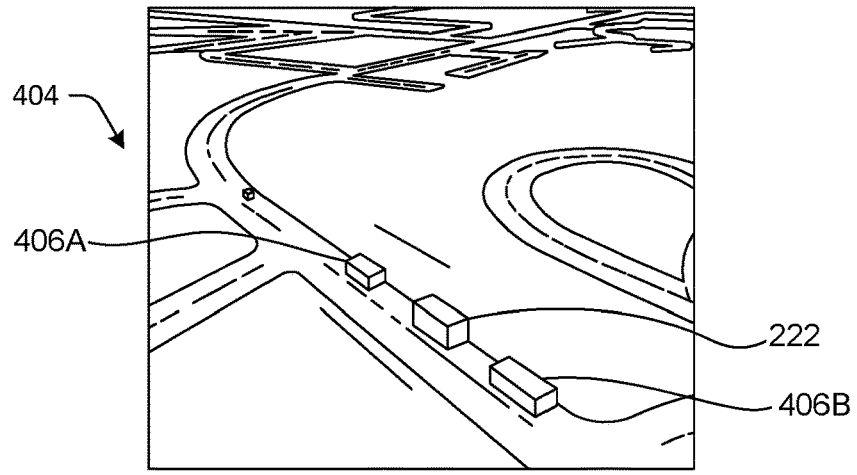
FIG. 4B shows a second example scenario of the many scenarios, as in FIG. 4A.
Figure 4C:
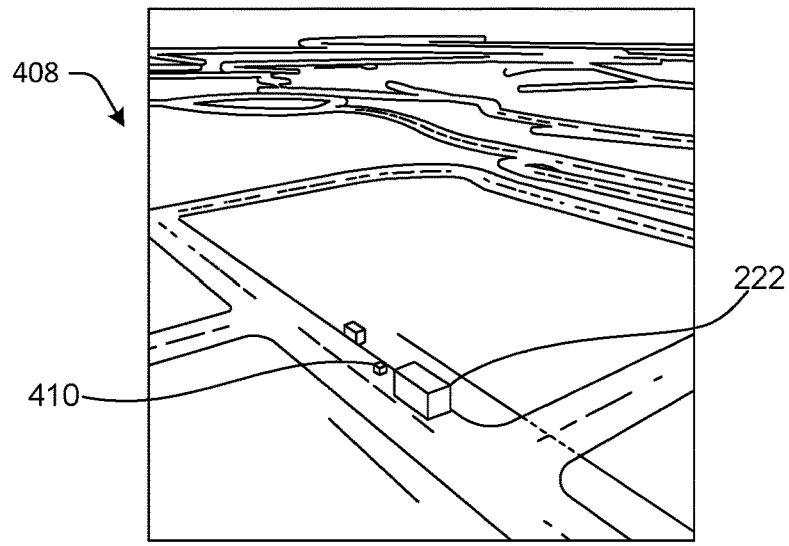
FIG. 4C shows a third example scenario of the many scenarios, as in FIG. 4A.
Figure 4D:
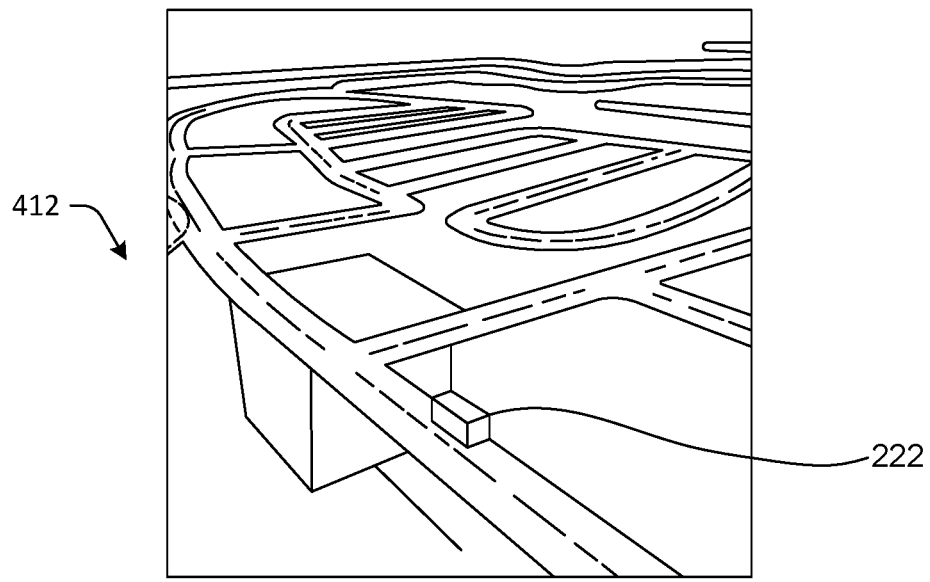
FIG. 4D shows a fourth example scenario of the many scenarios, as in FIG. 4A.
Figure 4E:
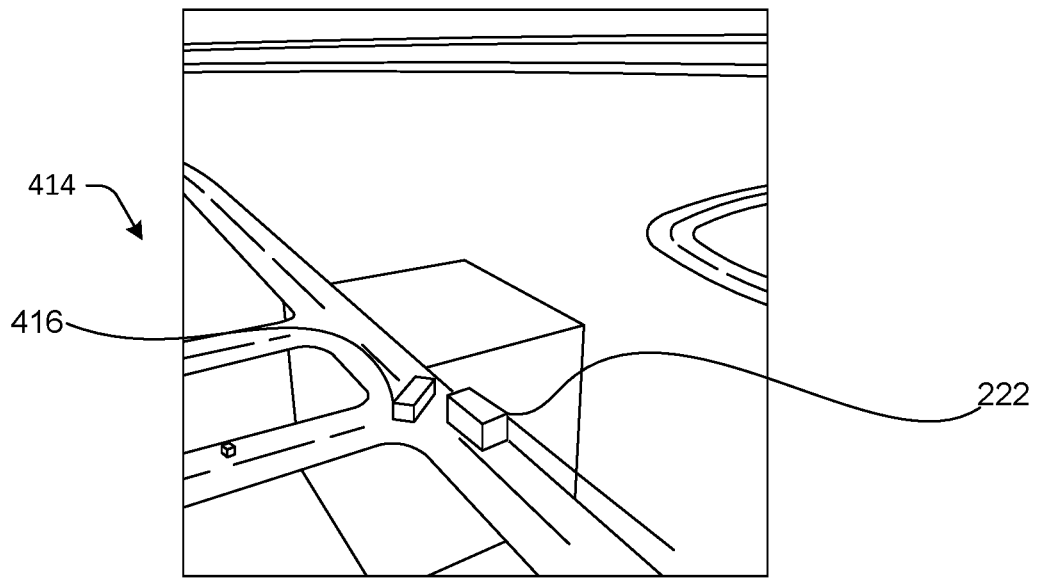
FIG. 4E shows a fifth example scenario of the many scenarios, as in FIG. 4A.

FIG. 3 depicts an illustration 300 of the scenario defined in FIG. 2 as would be run in a simulator. As shown, the larger block represents the test car 222 and the smaller block represents the observer car 226 positioned in an environment, such as a map. Line 320 above the blocks represents motion of the test car 222. As shown, the test car 222 approaches an intersection 310, waits, and then proceeds to follow the observer car 226 as prescribed by the sequence 228.

Outer Products

While the above examples have demonstrated how the SDL can enable a user to easily specify a single scenario, the SDL also enables a user to instantly generate multiple scenarios given a higher level (i.e., more general) description by a user. This creation of multiple scenarios based on high-level user descriptions is referred to as an outer product. An outer product accepts an arbitrary number of named arguments which define combinatorial values for generating test scenarios. Each named argument can correspond to a variable. Non-limiting examples of variables can include a position in a lane on a road, a time, surface conditions, etc. In some examples, a variable can be associated with a primitive. That is, a primitive can be associated with some aspect that can be varied to generate different scenarios. Each named argument receives a list of possible values for the corresponding variable. In at least one example, a possible value in the list of possible values can be a range of possible values. An iteration variable is then assigned which holds the assigned parameters for every combination of values. Each iteration can be associated with a more specific scenario and each scenario can be output for use in a simulation for testing and validation.

EQUATION 1 is provided below as a non-limiting example of an outer product described above.

$$\text{Parameters}(\text{variable1}=[\text{value1},\text{value2}],\text{variable2}=[\text{value3},\text{value4}]) \qquad \text{EQUATION 1}$$

In EQUATION 1, Parameters ( ), corresponds to the outer product. Variable 1 and variable 2 are examples of variables. An outer product can have an arbitrary number of variables, as described above. Each variable can include one or more possible values. In EQUATION 1, value 1 and value 2 are possible values for variable 1, and value 3 and value 4 are possible values for variable 2. The simulator can generate different scenarios based on different combinations of the values. That is, the simulator can create permutations of each possible combination of possible values. For instance, TABLE 1 shows a non-limiting example of the scenarios can be generated based on the outer product in EQUATION 1.

TABLE 1

| Scenario Number | Value(s) |
|---|---|
| 1 | value 1, value 3 |
| 2 | value 1, value 4 |
| 3 | value 2, value 3 |
| 4 | value 2, value 4 |

As a non-limiting example, consider the scenario described above with respect to FIGS. 2 and 3. In such a scenario, the "wait" condition 236 is associated with a value of one second. However, to achieve the combinatorial combinations described above, the time associated with the "wait" condition 236 can be varied. For instance, the time can be a value of one second or five seconds. A second variable in the scenario can correspond to the speed (or velocity) of the observer car 226. For instance, the speed (or velocity) of the observer car 226 can be varied. The observer car 226 can be travelling at 10 miles-per-hour (mph) or 30 mph. Consistent with the combinatorial combinations described above, a first scenario can correspond to a "wait" condition 236 associated with a value of one second when the observer car 226 is travelling at 10 mph, a second scenario can correspond to a "wait" condition 236 associated with a value of five seconds when the observer car 226 is travelling at 10 mph, a third scenario can correspond to a "wait" condition 236 associated with a value of one second when the observer car 226 is travelling at 30 mph, and a fourth scenario can correspond to a "wait" condition 236 associated with a value of five seconds when the observer car 226 is travelling at 30 mph.

FIGS. 4A-4E demonstrate the power of an outer product. As a non-limiting example, consider an outer product where a user specifies a range of starting positions and a range of a number of other primitives (e.g., entities with associated dimensions, velocities, and categories) to be instantiated. For instance, a first variable in the outer product can correspond to starting position and possible values associated with different starting positions can associated with the first variable, and a second variable in the outer product can correspond to a number of primitives and possible values associated with the number of primitives can correspond to the second variable.

As shown in FIGS. 4A-4E, multiple scenarios can be created by a single outer product, all categorized by having a single T-intersection and a single test car 222. The scenario 400 represented by FIG. 4A includes the test car 222 in a first starting position. There are two pedestrians 402A and 402B present and no other cars present. The scenario 404 represented by FIG. 4B includes the test car 222 in a second starting position and there are two other cars 406A and 406B present. The scenario 408 represented by FIG. 4C includes the test car 222 in a third starting position and there is one other car 410 present. The scenario 412 represented by FIG. 4D includes the test car 222 in a fourth starting position and there are no other cars or pedestrians present. The scenario 414 represented by FIG. 4E includes the test car 222 in a fifth starting position and there is one other car 416 present. As noted above, each of the scenarios, among many other scenarios, can be created using a single line of computer code.

In at least one example, variables included in the outer product can be optimized to limit which scenarios are created for validation and testing. In an additional and/or alternative example, heuristics can be employed to filter combinations of values generated to limit which scenarios are created for validation and testing. In at least one example, combinations of variables that are included in the outer product can be limited to variables that are determined to be associated with "useful scenarios," which can be determined by a machine learning algorithm.

Machine learning can refer to one or more programs that learns from the data it receives. For example, a machine learning mechanism can build, modify, or otherwise utilize a data model that is created from example inputs and makes predictions or decisions using the data model. In the current embodiment, the machine learning mechanism can be used to predict whether a scenario and/or combination of values output(s) redundant results. That is, the machine learning mechanism can leverage data associated with which scenarios pass (i.e., succeed) or fail (i.e., do not succeed) (per predefined criteria) and can determine which sets of scenarios collectively pass or fail. Based on said determination, the machine learning mechanism can determine that scenarios in a set of scenarios are redundant. The data model can be trained using supervised learning algorithms (e.g., artificial neural networks, Bayesian statistics, support vector machines, decision trees, classifiers, k-nearest neighbor, etc.), unsupervised learning algorithms (e.g., artificial neural networks, association rule learning, hierarchical clustering, cluster analysis, etc.), semi-supervised learning algorithms, deep learning algorithms, etc.

In at least one example, limiting which scenarios are created for validation and testing can reduce a number of required computations. That is, limiting which scenarios are created for validation and testing can reduce a number of required computations that are performed for scenarios that are likely to output useful information.

Computerized System

Figure 5:
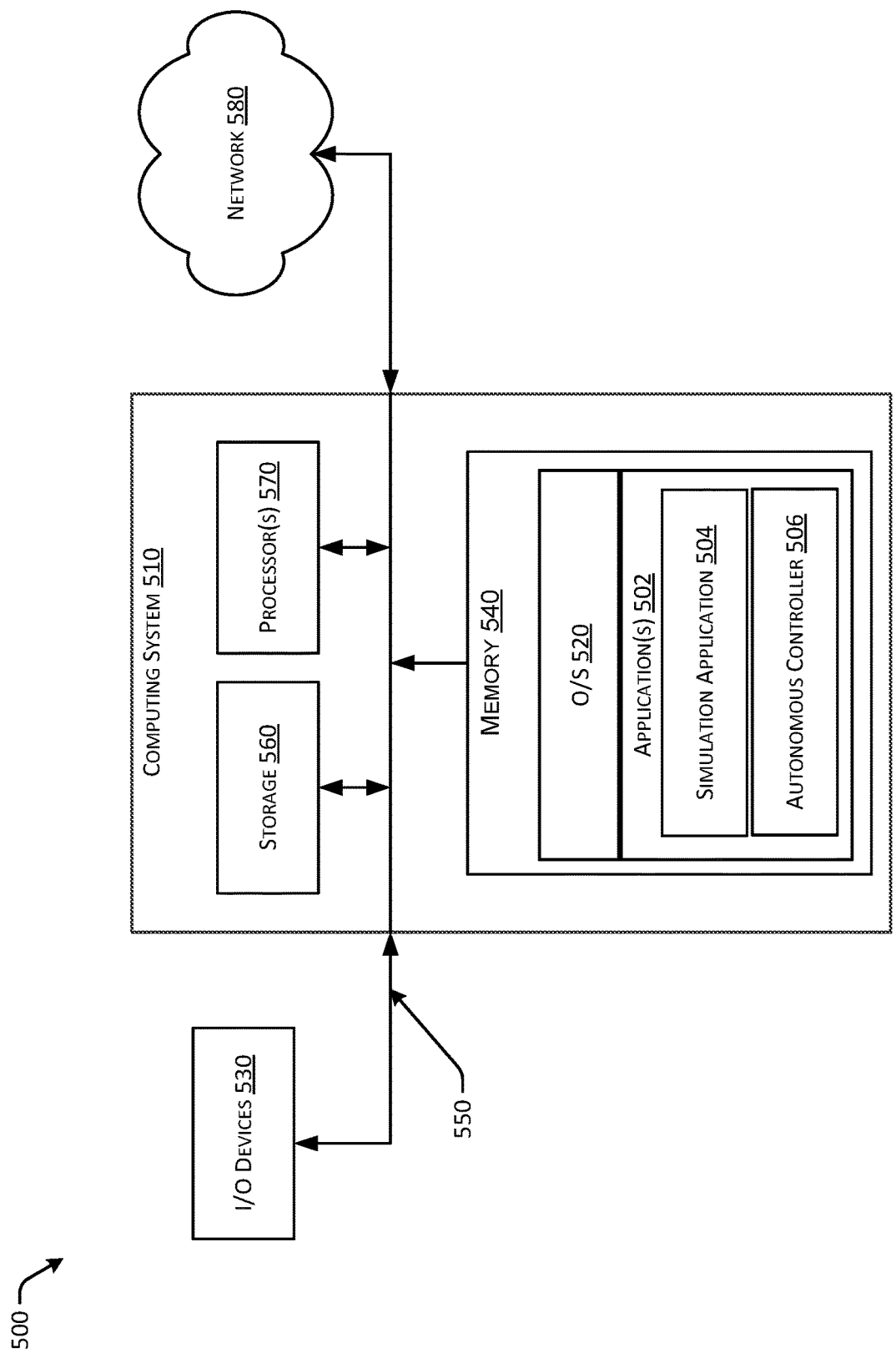
FIG. 5 illustrates an example computing system which can be used to define scenarios using the scenariodescription language and/or simulate scenarios defined using the scenario description language.

Turning briefly to FIG. 5, a computerized system 500 is depicted as an example computerized system on which the techniques described herein can be implemented. The computerized system 500 depicts a computer system 510 that comprises a storage 560, a processor 570, a memory 540, and an operating system 520. The storage 560, processor(s) 570, memory 540, and operating system 520 can be communicatively coupled over a communication infrastructure 550. Optionally, the computer system 510 can interact with a user via I/O devices 530, as well as a network 580, via the communication infrastructure 550. The operating system 520 can interact with other components to control application(s) 502. The application(s) 502 can include a simulation application 504, which can be executable by the processor(s) 570 to generate scenarios based on the SDL, described above, and an autonomous controller 506, which can be executable by the processor(s) 570 to respond to the scenarios created in the simulation environment. In at least one example, the autonomous controller 506 corresponds to software that is also run on autonomous vehicles, as described above. Accordingly, a response of the autonomous controller 506 can represent how an autonomous vehicle is likely to respond in a real environment.

The systems and methods described herein can be implemented in software or hardware or any combination thereof. The systems and methods described herein can be implemented using one or more computing devices which can or may not be physically or logically separate from each other. The methods can be performed by components arranged as either on-premise hardware, on-premise virtual systems, or hosted-private instances. Additionally, various aspects of the methods described herein can be combined or merged into other functions.

An example computerized system for implementing the techniques described herein is illustrated in FIG. 5. A processor or computer system can be configured to particularly perform some or all of the techniques described herein. In some examples, the techniques described herein can be partially or fully automated by one or more computers or processors. The techniques described herein can be implemented using a combination of any of hardware, firmware and/or software. The present method(s) (or any part(s) or function(s) thereof) can be implemented using hardware, software, firmware, or a combination thereof and can be implemented in one or more computer systems or other processing systems. In some examples, the illustrated system elements could be combined into a single hardware device or separated into multiple hardware devices. If multiple hardware devices are used, the hardware devices could be physically located proximate to or remotely from each other. The examples of the methods described and illustrated are intended to be illustrative and not to be limiting. For example, some or all of the steps of the methods can be combined, rearranged, and/or omitted in different examples.

In one exemplary example, techniques described herein can be directed toward one or more computer systems capable of carrying out the functionality described herein via an operating system (O/S) 520. Example computing devices can be, but are not limited to, a personal computer (PC) system running any operating system such as, but not limited to, Microsoft™ Windows™ However, the techniques described herein may not be limited to these platforms. Instead, the techniques described herein can be implemented on any appropriate computer system running any appropriate operating system. Other components of the techniques described herein, such as, but not limited to, a computing device, a communications device, mobile phone, a telephony device, a telephone, a personal digital assistant (PDA), a personal computer (PC), a handheld PC, an interactive television (iTV), a digital video recorder (DVD), client workstations, thin clients, thick clients, proxy servers, network communication servers, remote access devices, client computers, server computers, routers, web servers, data, media, audio, video, telephony or streaming technology servers, etc., can also be implemented using a computing device. Services can be provided on demand using, e.g., but not limited to, an interactive television (iTV), a video on demand system (VOD), and via a digital video recorder (DVR), or other on demand viewing system.

The computing system 510 can include one or more processors 570. The processor(s) 570 can be connected to a communication infrastructure 550, such as but not limited to, a communications bus, cross-over bar, or network, etc. The processes and processors need not be located at the same physical locations. In other words, processes can be executed at one or more geographically distant processors, over for example, a LAN or WAN connection. Computing devices can include a display interface that can forward graphics, text, and other data from the communication infrastructure for display on a display unit.

The computing system 510 can also include memory 540, which includes, but is not limited to, a main memory, random access memory (RAM), and a secondary memory, etc. The secondary memory can include, for example, a hard disk drive and/or a removable storage drive, such as a compact disk drive CD-ROM, etc. The removable storage drive can read from and/or write to a removable storage unit. As can be appreciated, the removable storage unit can include a computer usable storage medium having stored therein computer software and/or data. In some examples, a machine-accessible medium can refer to any storage device used for storing data accessible by a computer. Examples of a machine-accessible medium can include, e.g., but not limited to: a magnetic hard disk; a floppy disk; an optical disk, like a compact disk read-only memory (CD-ROM) or a digital versatile disk (DVD); a magnetic tape; and/or a memory chip, etc.

The processor(s) 570 can also include, or be operatively coupled to communicate with storage 560, such as one or more data storage devices for storing data. Such data storage devices can include, as non-limiting examples, magnetic disks (including internal hard disks and removable disks), magneto-optical disks, optical disks, read-only memory, random access memory, and/or flash storage. Storage devices suitable for tangibly embodying computer program instructions and data can also include all forms of non-volatile memory, including, for example, semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

Additionally and/or alternatively, storage 560 can be a computerized data storage system. The data storage system can include a non-relational or relational data store, such as a MySQL™ or other relational database. Other physical and logical database types could be used. The data store can be a database server, such as Microsoft SQL Server™, Oracle™, IBM DB2™, SQLITE™, or any other database software, relational or otherwise. The data store can store the information identifying syntactical tags and any information required to operate on syntactical tags. In some examples, the processing system can use object-oriented programming and can store data in objects. In these examples, the computing system 510 can use an object-relational mapper (ORM) to store the data objects in a relational database. The systems and methods described herein can be implemented using any number of physical data models. In one example, an RDBMS can be used. In those examples, tables in the RDBMS can include columns that represent coordinates. In the case of economic systems, data representing companies, products, etc. can be stored in tables in the RDBMS. The tables can have pre-defined relationships between them. The tables can also have adjuncts associated with the coordinates.

In alternative exemplary examples, the memory 540 can include secondary memory can include other similar devices for allowing computer programs or other instructions to be loaded into the computing system 510. Such devices can include, for example, a removable storage unit and an interface. Examples of such can include a program cartridge and cartridge interface (such as, e.g., but not limited to, those found in video game devices), a removable memory chip (such as, e.g., but not limited to, an erasable programmable read only memory (EPROM), or programmable read only memory (PROM) and associated socket, and other removable storage units and interfaces, which can allow software and data to be transferred from the removable storage unit to computer system.

The computing system 510 can also include input/output (I/O) devices 530. An example of an I/O device 530 can include an input device, such as but not limited to, a mouse or other pointing device such as a digitizer, and a keyboard or other data entry device (not shown). Another example of an I/O device 530 can include an output device, such as but not limited to, a display, and a display interface. The further more I/O devices 530 can include, but are not limited to, a communications interface, cable and communications path, etc. These devices can include, but are not limited to, a network interface card, and modems. Communications interface can allow software and data to be transferred between computer system and external devices.

In one or more examples, the present examples are practiced in the environment of a computer network or networks, such as network 580. The network 580 can include a private network, or a public network (for example the Internet, as described below), or a combination of both. The network 580 includes hardware, software, or a combination of both.

From a telecommunications-oriented view, the network 580 can be described as a set of hardware nodes interconnected by a communications facility, with one or more processes (hardware, software, or a combination thereof) functioning at each such node. The processes can intercommunicate and exchange information with one another via communication pathways between them using interprocess communication pathways. On these pathways, appropriate communications protocols are used.

An exemplary computer and/or telecommunications network environment in accordance with the present examples can include node, which include can hardware, software, or a combination of hardware and software. The nodes can be interconnected via a communications network. Each node can include one or more processes, executable by processors incorporated into the nodes. A single process can be run by multiple processors, or multiple processes can be run by a single processor, for example. Additionally, each of the nodes can provide an interface point between network and the outside world, and can incorporate a collection of sub-networks.

In an exemplary example, the processes can communicate with one another through interprocess communication pathways supporting communication through any communications protocol. The pathways can function in sequence or in parallel, continuously or intermittently. The pathways can use any of the communications standards, protocols or technologies, described herein with respect to a communications network, in addition to standard parallel instruction sets used by many computers.

The nodes can include any entities capable of performing processing functions. Examples of such nodes that can be used with the examples include computers (such as personal computers, workstations, servers, or mainframes), handheld wireless devices and wireline devices (such as personal digital assistants (PDAs), modem cell phones with processing capability, wireless email devices including BlackBerry™ devices), document processing devices (such as scanners, printers, facsimile machines, or multifunction document machines), or complex entities (such as local-area networks or wide area networks) to which are connected a collection of processors, as described. For example, in the context of the present techniques described herein, a node itself can be a wide-area network (WAN), a local-area network (LAN), a private network (such as a Virtual Private Network (VPN)), or collection of networks.

Communications between the nodes can be made possible by a communications network. A node can be connected either continuously or intermittently with communications network. As an example, in the context of the present techniques described herein, a communications network can be a digital communications infrastructure providing adequate bandwidth and information security.

The communications network can include wireline communications capability, wireless communications capability, or a combination of both, at any frequencies, using any type of standard, protocol or technology. In addition, in the present examples, the communications network can be a private network (for example, a VPN) or a public network (for example, the Internet).

A non-inclusive list of exemplary wireless protocols and technologies used by a communications network can include Bluetooth™, general packet radio service (GPRS), cellular digital packet data (CDPD), mobile solutions platform (MSP), multimedia messaging (MMS), wireless application protocol (WAP), code division multiple access (CDMA), short message service (SMS), wireless markup language (WML), handheld device markup language (HDML), binary runtime environment for wireless (BREW), radio access network (RAN), and packet switched core networks (PS-CN). Also included are various generation wireless technologies. An exemplary non-inclusive list of primarily wireline protocols and technologies used by a communications network includes asynchronous transfer mode (ATM), enhanced interior gateway routing protocol (EIGRP), frame relay (FR), high-level data link control (HDLC), Internet control message protocol (ICMP), interior gateway routing protocol (IGRP), internetwork packet exchange (IPX), ISDN, point-to-point protocol (PPP), transmission control protocol/internet protocol (TCP/IP), routing information protocol (RIP) and user datagram protocol (UDP). As skilled persons will recognize, any other known or anticipated wireless or wireline protocols and technologies can be used.

Examples of the present techniques described herein can include apparatuses for performing the operations herein. An apparatus can be specially constructed for the desired purposes, or it can comprise a general purpose device selectively activated or reconfigured by a program stored in the device.

In one or more examples, the present examples are embodied in machine-executable instructions. The instructions can be used to cause a processing device, for example a general-purpose or special-purpose processor, which is programmed with the instructions, to perform the steps of the present techniques described herein. Alternatively, the steps of the present techniques described herein can be performed by specific hardware components that contain hardwired logic for performing the steps, or by any combination of programmed computer components and custom hardware components. For example, the present techniques described herein can be provided as a computer program product, an application, etc., as described below. In this environment, the examples can include a machine-readable medium having instructions stored on it. The instructions can be used to program any processor or processors (or other electronic devices) to perform a process or method according to the present exemplary examples. In addition, the present techniques described herein can also be downloaded and stored on a computer program product. Here, the program can be transferred from a remote computer (e.g., a server) to a requesting computer (e.g., a client) by way of data signals embodied in a carrier wave or other propagation medium via a communication link (e.g., a modem or network connection) and ultimately such signals can be stored on the computer systems for subsequent execution).

The methods can be implemented in a computer program product accessible from a computer-usable or computer-readable storage medium that provides program code for use by or in connection with a computer or any instruction execution system. A computer-usable or computer-readable storage medium can be any apparatus that can contain or store the program for use by or in connection with the computer or instruction execution system, apparatus, or device. An application 502 can be a computer program product designated to perform functions, tasks, activities, etc. In some examples, an application 502 can include one or more modules, which are typically functional such that they that can generate useful data or other output using specified input(s).

A data processing system suitable for storing and/or executing the corresponding program code can include at least one processor coupled directly or indirectly to computerized data storage devices such as memory elements. Input/output (I/O) devices (including but not limited to keyboards, displays, pointing devices, etc.) can be coupled to the system. Network adapters can also be coupled to the system to enable the data processing system to become coupled to other data processing systems or remote printers or storage devices through intervening private or public networks. To provide for interaction with a user, the features can be implemented on a computer with a display device, such as an LCD (liquid crystal display), or another type of monitor for displaying information to the user, and a keyboard and an input device, such as a mouse or trackball by which the user can provide input to the computer.

A computer program can be a set of instructions that can be used, directly or indirectly, in a computer. The systems and methods described herein can be implemented using programming languages such as Flash™, JAVA™, C++, C, C#, Python, Visual Basic™, JavaScript™ PHP, XML, HTML, etc., or a combination of programming languages, including compiled or interpreted languages, and can be deployed in any form, including as a stand-alone program or as a module, component, subroutine, or other unit suitable for use in a computing environment. The software can include, but is not limited to, firmware, resident software, microcode, etc. Protocols such as SOAP/HTTP can be used in implementing interfaces between programming modules. The components and functionality described herein can be implemented on any desktop operating system executing in a virtualized or non-virtualized environment, using any programming language suitable for software development, including, but not limited to, different versions of Microsoft Windows™, Apple™ Mac™, iOS™, Unix™/X-Windows™, Linux™, etc. The system could be implemented using a web application framework, such as Ruby on Rails. Suitable processors for the execution of a program of instructions include, but are not limited to, general and special purpose microprocessors, and the sole processor or one of multiple processors or cores, of any kind of computer. A processor can receive and store instructions and data from a computerized data storage device such as a read-only memory, a random access memory, both, or any combination of the data storage devices described herein. A processor can include any processing circuitry or control circuitry operative to control the operations and performance of an electronic device.

The systems, modules, and methods described herein can be implemented using any combination of software or hardware elements. The systems, modules, and methods described herein can be implemented using one or more virtual machines operating alone or in combination with one other. Any applicable virtualization solution can be used for encapsulating a physical computing machine platform into a virtual machine that is executed under the control of virtualization software running on a hardware computing platform or host. The virtual machine can have both virtual system hardware and guest operating system software.

The systems and methods described herein can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks that form the Internet.

One or more examples of the techniques described herein can be practiced with other computer system configurations, including hand-held devices, microprocessor systems, microprocessor-based or programmable consumer electronics, minicomputers, mainframe computers, etc. The techniques described herein can also be practiced in distributed computing environments where tasks are performed by remote processing devices that are linked through a network.

The terms "computer program medium" and "computer readable medium" can be used to generally refer to media such as but not limited to removable storage drive, a hard disk installed in hard disk drive. These computer program products can provide software to computer system. The techniques described herein can be directed to such computer program products.

References to "one example," "an example," "various examples," etc., can indicate that the example(s) of the techniques described herein so described can include a particular feature, structure, or characteristic, but not every example necessarily includes the particular feature, structure, or characteristic. Further, repeated use of the phrase "in one example," or "in an exemplary example," do not necessarily refer to the same example, although they can.

In the description and claims, the terms "coupled" and "connected," along with their derivatives, can be used. It should be understood that these terms can be not intended as synonyms for each other. Rather, in particular examples, "connected" can be used to indicate that two or more elements are in direct physical or electrical contact with each other. "Coupled" can mean that two or more elements are in direct physical or electrical contact. However, "coupled" can also mean that two or more elements are not in direct contact with each other, but yet still co-operate or interact with each other.

An algorithm can be here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, it can be appreciated that throughout the specification terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

In a similar manner, the term "processor" can refer to any device or portion of a device that processes electronic data from registers and/or memory to transform that electronic data into other electronic data that can be stored in registers and/or memory. A "computing platform" can comprise one or more processors. As used herein, "software" processes can include, for example, software and/or hardware entities that perform work over time, such as tasks, threads, and intelligent agents. Also, each process can refer to multiple processes, for carrying out instructions in sequence or in parallel, continuously or intermittently. The terms "system" and "method" are used herein interchangeably insofar as the system can embody one or more methods and the methods can be considered as a system.

Example Processes

Figure 6:
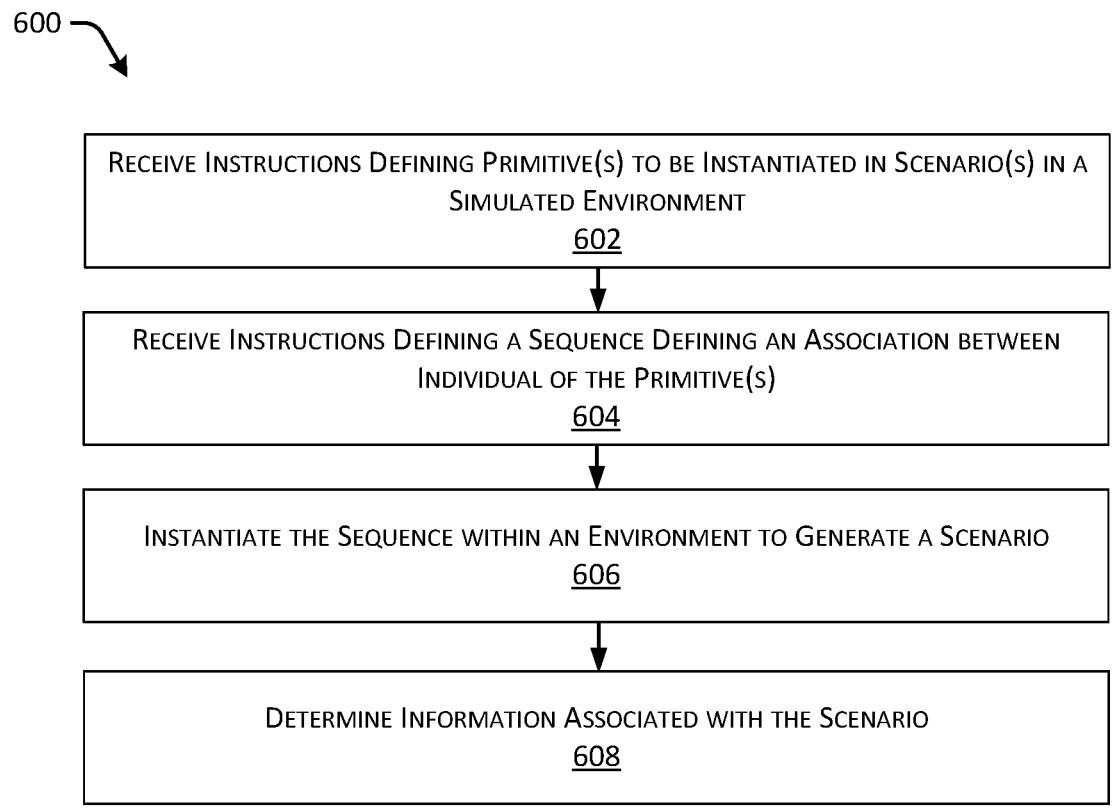
FIG. 6 illustrates an example process for constructing a scenario in a simulation environment.
Figure 7:
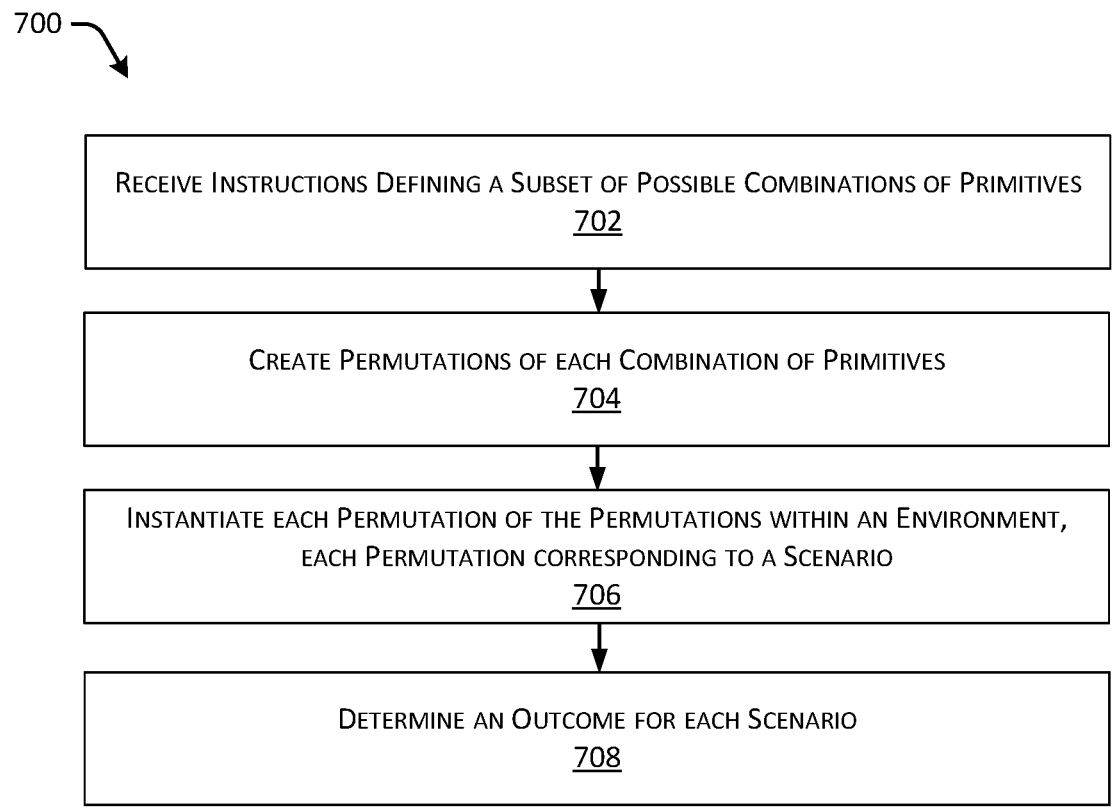
FIG. 7 illustrates an example process for generating multiple scenarios by combinatorially combining primitives as defined by a user using the scenario description language.
Figure 8:
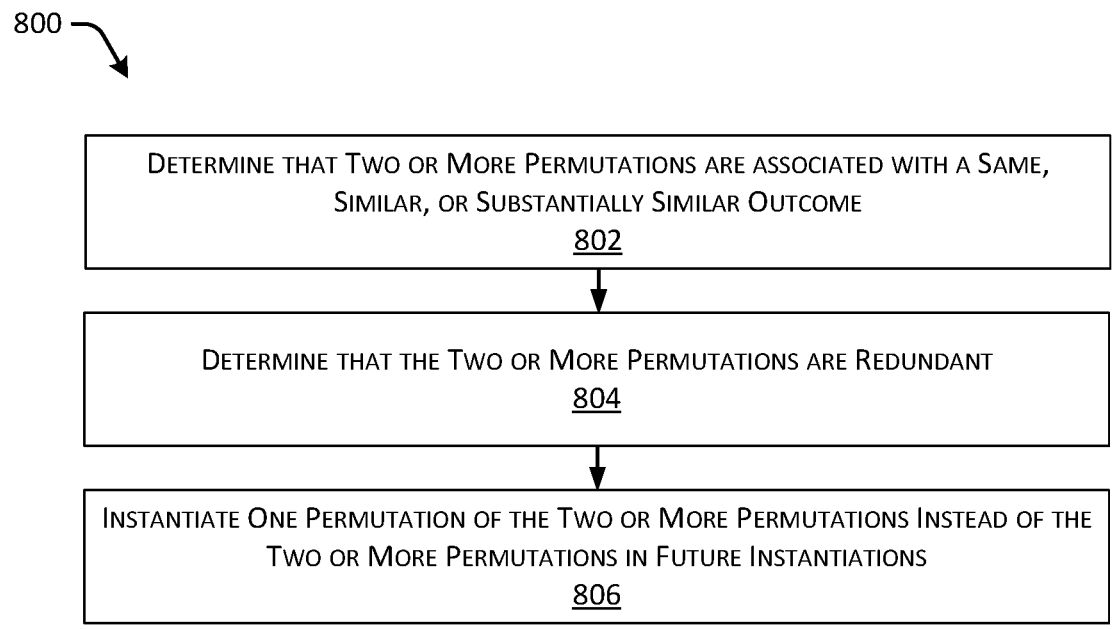
FIG. 8 illustrates an example process for determining scenarios that provide useful information and filtering out other scenarios that do not provide useful information.

FIGS. 6-8 illustrate example processes for constructing scenario(s) in a simulation environment utilizing the SDL described herein. FIGS. 6-8 are described in the context of FIGS. 1-5, but are not limited to such contexts.

FIG. 6 illustrates an example process 600 for constructing a scenario in a simulation environment.

Block 602 illustrates receiving instructions defining primitive(s) to be instantiated in scenario(s) in a simulated environment. In at least one example, a user can use the SDL to define one or more primitives that are to be instantiated in a scenario. The simulation application 504 can receive the instructions defining one or more primitives that are to be instantiated in the scenario. As described above, a primitive defines a specific aspect of a simulation environment. Non-limiting examples of primitives include coordinate systems, conditions, actions, entities, entity behaviors, noises, faults, etc. In at least one example, the simulation application 504 can receive specifics about the one or more primitives. For example, a user can use the SDL to define an entity having a certain dimension, a pose (e.g., using track coordinates, inertial coordinates, or semantic coordinates), as well as specify certain speeds (or velocities) of entities by assigning an entity behavior to the entity. In at least one example, at least one primitive can be designated as an "autonomous vehicle" and can be associated with an autonomous controller 506 such that output of a simulation validates a behavior of an autonomous vehicle that would be controlled by such an autonomous controller, as described above.

Block 604 illustrates receiving instructions defining a sequence defining an association between individual of the primitive(s). As described above, the SDL allows a user to specify how certain primitives are associated with one another, for example, using a linear temporal logic. In one example, a user defines an association between primitives by specifying a sequence. In such an example, the simulation application 504 can receive the instructions defining the sequence. In at least one example, the sequence can include multiple steps, which are to be performed in sequential order by the simulation application 504. In at least one example, the sequences can include another such that one step in a sequence is another sequence.

Block 606 illustrates instantiating the sequence within an environment to generate a scenario. In at least one example, the simulation application 504 can include instructions that are executable by one or more processors (e.g., processor(s) 570) to instantiate the sequence within an environment to generate a scenario. As described above, in some examples, the environment can be a map. Maps can be two dimensional or three dimensional. Two- and/or three-dimensional maps can be any number of data structures capable of providing information about an environment, such as, but not limited to, topologies (such as intersections), streets, mountain ranges, roads, terrain, and the environment in general. A scenario can be generated based at least in part on the simulation application 504 instantiating the sequence within a map.

Block 608 illustrates determining information associated with the scenario. Based at least in part on instantiating the sequence within the map, various information can be learned based on how an autonomous controller 506 responds given the scenario created in the simulation environment. As described above, the autonomous controller 506 can correspond to software that is also run on autonomous vehicles. Based at least in part on instantiating the sequence within the map, information can be learned regarding how the autonomous controller 506 responds to validate that the autonomous controller 506 is able to safely control such autonomous vehicles. In additional and/or alternative examples, based at least in part on instantiating the sequence within the map, information can be learned about the constraints of autonomous vehicles running based on the autonomous controller 506. For instance, based at least in part on instantiating the sequence within the map, simulations can be used to understand the operational space of an autonomous vehicle in view of surface conditions, ambient noise, faulty components, etc. Or, information can also be useful for generating feedback for improving operations and designs of autonomous vehicles. For instance, in some examples, based at least in part on instantiating the sequence within the map, information can be learned for determining an amount of redundancy that is required in the autonomous controller 506, or how to modify a behavior of the autonomous controller 506 based on what is learned.

FIG. 7 illustrates an example process 700 for generating multiple scenarios by combinatorially combining primitives as defined by a user using the scenario description language.

Block 702 illustrates receiving instructions defining a subset of possible combinations of primitives. As described above, an outer product accepts an arbitrary number of named arguments which define combinatorial values for generating test scenarios. Each named argument can correspond to a variable. In some examples, a variable can be associated with a primitive. That is, a primitive can be associated with some aspect that can be varied to generate different scenarios. In at least one example, each named argument receives a list of possible values for the corresponding variable. In at least one example, a user can define the named arguments and possible values for each named argument. A non-limiting example of an outer product defined by a user is shown above with reference to EQUATION 1. The simulation application 504 can receive the named arguments and possible values for each named argument.

Block 704 illustrates creating permutations of each combination of primitives. The simulation application 504 can assign an iteration variable which holds the assigned parameters for every combination of values. That is, the simulation application 504 can generate permutations for combinations of possible values associated with the primitives. A non-limiting example of permutations resulting from an outer product is shown above with reference to TABLE 1.

Block 706 illustrates instantiating each permutation of the permutations within an environment, each permutation corresponding to a scenario. In at least one example, the simulation application 504 can include instructions that are executable by one or more processors (e.g., processor(s) 570)) to instantiate a sequence, in view of the outer product, within an environment to generate multiple scenarios. As described above, in some examples, the environment can be a map. Each permutation can generate a different scenario. That is, multiple scenarios can be generated based at least in part on the simulation application 504 instantiating the sequence within a map in view of the various permutations of possible values. Each iteration can then be associated with a more specific scenario.

Block 708 illustrates determining an outcome for each scenario. In at least one example, the simulation application 504 can output each scenario for use in a simulation for testing and validation. As described above, based at least in part on instantiating the permutations within the map, various information can be learned based on how the autonomous controller 506 responds given the scenario created in the simulation environment. In at least one example, the simulation application 504 can access data indicating how the autonomous controller 506 performed (i.e., responded) and can compare the data to a predetermined outcome (e.g., outcome(s) 124a-124n). Based at least in part on determining that the autonomous controller 506 performed consistent with the predetermined outcome (that is, the autonomous controller 506 did everything it was supposed to do), the simulation application 504 can determine that the autonomous controller succeeded. Based at least in part on determining that the autonomous controller 506 performed inconsistent with the predetermined outcome (that is, the autonomous controller 506 did something that it wasn't supposed to do), the simulation application 504 can determine that the autonomous controller failed. Accordingly, based at least in part on instantiating the permutations within the map, information can be learned about how the autonomous controller 506 responds to each scenario, as described above.

FIG. 8 illustrates an example process 800 for determining scenarios that provide useful information and filtering out other scenarios that do not provide useful information.

Block 802 illustrates determining that two or more permutations are associated with a same, similar, or substantially similar outcome. Based at least in part on instantiating the permutations within an environment, as described above with reference to FIG. 7, various information can be learned based on how an autonomous controller 506 responds given a scenario (or scenarios) created in a simulation environment. In at least one example, the simulation application 504 can access data indicating how the autonomous controller 506 performed and can compare the data to a predetermined outcome (e.g., outcome(s) 124a-124n). Based at least in part on determining that the autonomous controller 506 performed consistent with the predetermined outcome (that is, the autonomous controller 506 did everything it was supposed to do), the simulation application 504 can determine that the autonomous controller succeeded. Based at least in part on determining that the autonomous controller 506 performed inconsistent with the predetermined outcome (that is, the autonomous controller 506 did something that it wasn't supposed to do), the simulation application 504 can determine that the autonomous controller failed.

In at least one example, the simulation application 504 can determine that data associated with how the autonomous controller 506 performed in instantiations of two or more of the permutations indicates that the two or more of the permutations are associated with a same outcome. That is, the simulation application 504 can determine that two or more of the permutations are associated with successful outcomes or unsuccessful outcomes. In an additional and/or alternative example, the simulation application 504 can determine that two or more of the permutations are associated some other shared outcome (e.g., a confidence level, recommendation, etc.).

Block 804 illustrates determining that the two or more permutations are redundant. Based at least in part on the simulation application 504 determining that two or more of the permutations are associated with a same outcome, the simulation application 504 can determine that the two or more permutations are redundant. That is, in at least one example the simulation application 504 can determine that the two or more of the permutations are associated with incremental differences that provide marginal, if any, additional useful information about the ability of autonomous controller 506 to respond in the scenario(s).

Block 806 illustrates instantiating one permutation of the two or more permutations instead of the two or more permutations in future instantiations. Based at least in part on the simulation application 504 determining that two or more of the permutations are redundant, the simulation application 504 can filter out one or more of the two or more permutations. That is, the simulation application 504 can identify a representative permutation for the two or more permutations. As a result, in future instantiations, the representative permutation can be instantiated instead of instantiating each of the two or more permutations. Accordingly, the simulation application can instantiate scenarios determined to provide useful information to reduce computational complexity, memory requirements, and processing time by optimizing over specific scenarios which provide useful information for validation and testing.

Example Clauses

A. A computer-implemented method for generating a scenario in a simulation environment, the computer-implemented method comprising: receiving instructions defining at least a first primitive that is to be instantiated in the scenario, the first primitive corresponding to an autonomous vehicle; receiving instructions associated with one or more values to be assigned to the first primitive; creating, based at least in part on the one or more values, a set of permutations of the first primitive, each permutation associated with a different value of the one or more values; instantiating each of the permutations within a map to generate scenarios, each scenario corresponding to a permutation of the set of permutations; and determining information associated with a scenario of the scenarios, the information describing how an autonomous controller associated with the autonomous vehicle responds given the scenario created in the simulation environment.

B. The computer-implemented method as paragraph A recites, wherein the first primitive is associated with one or more of a body having a defined set of dimensions, a pose, or a mesh to render the first primitive in the simulation environment.

C. The computer-implemented method as paragraph B recites, wherein the pose is defined by an inertial coordinate system, a map based coordinate system, or a track based coordinate system.

D. The computer-implemented method as paragraph B or C recites, wherein the first primitive is associated with an entity behavior indicating how the first primitive is to behave in the scenario.

E. The computer-implemented method as any of paragraphs A-D recite, wherein the instructions further include a sequence defining an association between the first primitive and at least a second primitive, the sequence including multiple steps that are performed in sequential order.

F. The computer-implemented method as paragraph E recites, wherein the second primitive corresponds to a second entity.

G. The computer-implemented method as paragraph F recites, wherein the second entity is a static entity or a dynamic entity.

H. The computer-implemented method as any of paragraphs E-G recite, wherein the second primitive corresponds to a condition, an action, a fault, or a noise.

I. One or more computer-readable media encoded with instructions that, when executed by a processor, configure a computer to perform a method as any of paragraphs A-H.

J. A device comprising one or more processors and one or more computer readable media encoded with instructions that, when executed by the one or more processors, configure a computer to perform a computer-implemented method as recited in any of paragraphs A-H.

K. A computer-implemented method for generating a scenario in a simulation environment, the computer-implemented method comprising: means for receiving instructions defining at least a first primitive that is to be instantiated in the scenario, the first primitive corresponding to an autonomous vehicle; means for receiving instructions associated with one or more values to be assigned to the first primitive; means for creating, based at least in part on the one or more values, a set of permutations of the first primitive, each permutation associated with a different value of the one or more values; means for instantiating each of the permutations within a map to generate scenarios, each scenario corresponding to a permutation of the set of permutations; and means for determining information associated with a scenario of the scenarios, the information describing how an autonomous controller associated with the autonomous vehicle responds given the scenario created in the simulation environment.

L. The computer-implemented method as paragraph K recites, wherein the first primitive is associated with one or more of a body having a defined set of dimensions, a pose, or a mesh to render the first primitive in the simulation environment.

M. The computer-implemented method as paragraph L recites, wherein the pose is defined by an inertial coordinate system, a map based coordinate system, or a track based coordinate system.

N. The computer-implemented method as paragraph L or M recites, wherein the first primitive is associated with an entity behavior indicating how the first primitive is to behave in the scenario.

O. The computer-implemented method as any of paragraphs K-N recite, wherein the instructions further include a sequence defining an association between the first primitive and at least a second primitive, the sequence including multiple steps that are performed in sequential order.

P. The computer-implemented method as paragraph O recites, wherein the second primitive corresponds to a second entity.

Q. The computer-implemented method as paragraph P recites, wherein the second entity is a static entity or a dynamic entity.

R. The computer-implemented method as any of paragraphs O-Q recite, wherein the second primitive corresponds to a condition, an action, a fault, or a noise.

S. A system for generating scenarios in a simulation environment, the system comprising: one or more processors; one or more non-transitory computer-readable media storing instructions executable by the one or more processors, wherein the instructions program the one or more processors to perform actions comprising: receiving instructions defining a set of primitives to be instantiated in at least one scenario in the simulation environment; receiving a first sequence defining an association between individual primitives in the set of primitives; instantiating the first sequence within the simulation environment to generate a first scenario; and determining information associated with the first scenario, the information describing how an autonomous controller responds given the at least one scenario created in the simulation environment.

T. The system as paragraph S recites, wherein the first sequence includes at least one subsequence.

U. The system as paragraph S or T recites, wherein the first sequence is defined using linear temporal logic.

V. The system as any of paragraphs S-U recite, wherein the actions further comprise: receiving an outer product associated with the first sequence, the outer product including two or more variables and two or more possible values associated with each variable of the two or more variables, each variable of the two or more variables being associated with a primitive in the set of primitives; creating a set of permutations comprising each possible combination of the two or more possible values associated with each variable of the two or more variables; instantiating each permutation of the set of permutations within the simulation environment, each permutation corresponding to a new scenario; and determining an outcome for each new scenario, the outcome being successful or unsuccessful.

W. The system as any of paragraphs S-V recite, wherein the actions further comprise: receiving a second sequence defining a different association between individual primitives in the set of primitives; and instantiating the second sequence within the simulation environment to generate a second scenario.

X. The system as paragraph W recites, wherein the actions further comprise instantiating the first sequence and the second sequence substantially simultaneously.

Y. The system as any of paragraphs S-X recite, wherein determining information associated with the first scenario comprises validating how the autonomous controller responds given the at least one scenario created in the simulation environment.

Z. The system as any of paragraphs S-Y recite, wherein determining information associated with the first scenario comprises determining an operational space of the autonomous controller given the at least one scenario created in the simulation environment.

AA. The system as any of paragraphs S-Z recite, wherein determining information associated with the first scenario comprises generating feedback for improving at least one of operations or designs of the autonomous controller in view of how the autonomous controller responds given the at least one scenario created in the simulation environment.

AB. A non-transitory computer-readable medium having a set of instructions that, when executed, cause one or more processors to perform operations comprising: receiving, as part of a sequence for generating at least one simulated scenario, a subset of possible combinations of primitives; creating a set of permutations, each permutation comprising one possible combination of primitives from the subset of possible combinations of primitives; instantiating each permutation of the set of permutations within a map, each permutation corresponding to a simulated scenario; and determining an outcome for each simulated scenario, the outcome being successful or unsuccessful.

AC. The non-transitory computer-readable medium as paragraph AB recites, the operations further comprising: determining that two or more permutations of the set of permutations are associated with a same outcome; determining that the two or more permutations are redundant; and instantiating only one permutation of the two or more permutations instead of each permutation of the two or more permutations in future instantiations.

AD. The non-transitory computer-readable medium as paragraph AB or AC recites, wherein instantiating each permutation of the primitives within the map is performed substantially simultaneously and in parallel.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein can be presented in a certain order, in some cases the ordering can be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

What we claim is:

1. A system comprising:
   one or more processors; and
   one or more non-transitory computer-readable media storing instructions executable by the one or more processors, wherein the instructions program the one or more processors to perform operations comprising:
      receiving, as a first input to an application, a set of values representing an object and at least one of: an object behavior, a first condition, or a first action to be included in a simulated scenario;
      receiving a second input to the application indicating a type of road intersection;
      defining, based at least in part on linear temporal logic, a sequence of multiple steps to be performed in sequential order between the set of values and at least one of: a second condition, a second action, a fault, or a noise during execution of the simulated scenario;
      determining a semantic coordinate representing the set of values in a map, the semantic coordinate indicative of the type of road intersection;
      generating, based at least in part on the set of values, the sequence defined based at least in part on the linear temporal logic, and the semantic coordinate, the simulated scenario for execution; and
      determining, based at least in part on executing the simulated scenario, outcome data indicating a response by an autonomous controller to the simulated scenario.

2. The system of claim 1, wherein the object is associated with at least one of a body comprising a defined dimension, a pose, or a mesh to render the object in the simulated scenario.

3. The system of claim 1, wherein the outcome data is based at least in part on an evaluation of the linear temporal logic.

4. The system of claim 1, wherein determining the outcome data indicating the response by the autonomous controller to the simulated scenario comprises determining an operational space of the autonomous controller given the simulated scenario.

5. The system of claim 1, wherein the simulated scenario represents an interaction between the object and the type of road intersection.

6. The system of claim 1, wherein the simulated scenario comprises a first scenario and the sequence of multiple steps comprises a first combination of values associated with the first scenario and a second combination of values associated with a second scenario, and the operations further comprising:
   determining whether the first combination of values and the second combination of values are associated with same outcome data; and performing at least one of:
      executing only one of the first scenario or the second scenario when the first combination of values and the second combination of values are associated with the same outcome data; or
      executing the first scenario and the second scenario when the first combination of values and the second combination of values are not associated with the same outcome data.

7. The system of claim 1, the operations further comprising determining to modify a behavior of the autonomous controller based at least in part on the outcome data wherein the object comprises a static object or a dynamic object.

8. The system of claim 1, wherein the object comprises a static object or a dynamic object.

9. The system of claim 1, wherein the object is associated with an inertial coordinate system, a map based coordinate system, or a track based coordinate system.

10. A method comprising:
    receiving, as a first input to an application, a set of values representing an object and at least one of: an object behavior, a first condition, or a first action to be included in a simulated scenario;
    receiving a second input to the application indicating a type of road intersection;
    defining, based at least in part on linear temporal logic, a sequence of multiple steps to be performed in sequential order between the set of values and at least one of: a second condition, a second action, a fault, or a noise during execution of the simulated scenario;
    determining a semantic coordinate representing the set of values in a map, the semantic coordinate indicative of the type of road intersection;

generating, based at least in part on the set of values, the sequence defined based at least in part on the linear temporal logic, and the semantic coordinate, the simulated scenario for execution; and determining, based at least in part on executing the simulated scenario, outcome data indicating a response by an autonomous controller to the simulated scenario.

11. The method of claim 10, further comprising determining to modify a behavior of the autonomous controller based at least in part on the outcome data.

12. The method of claim 10, wherein the object is associated with at least one of a body comprising a defined dimension, a pose, or a mesh to render the object in the simulated scenario.

13. The method of claim 10, wherein the outcome data is based at least in part on an evaluation of the linear temporal logic.

14. The method of claim 10, wherein determining the outcome data indicating the response by the autonomous controller to the simulated scenario comprises determining an operational space of the autonomous controller given the simulated scenario.

15. The method of claim 10, wherein the simulated scenario represents an interaction between the object and the type of road intersection.

16. The method of claim 10, wherein the simulated scenario comprises a first scenario and the sequence of multiple steps comprises a first combination of values associated with the first scenario and a second combination of values associated with a second scenario, and further comprising:

determining whether the first combination of values and the second combination of values are associated with same outcome data; and performing at least one of:
executing only one of the first scenario or the second scenario when the first combination of values and the second combination of values are associated with the same outcome data; or
executing the first scenario and the second scenario when the first combination of values and the second combination of values are not associated with the same outcome data.

17. A non-transitory computer-readable medium storing instructions executable by one or more processors, wherein the instructions, when executed, cause the one or more processors to perform operations comprising:

receiving, as a first input to an application, a set of values representing an object and at least one of: an object behavior, a first condition, or a first action to be included in a simulated scenario;

receiving a second input to the application indicating a type of road intersection;

defining, based at least in part on linear temporal logic, a sequence of multiple steps to be performed in sequential order between the set of values and at least one of: a second condition, a second action, a fault, or a noise during execution of the simulated scenario;

determining a semantic coordinate representing the set of values in a map, the semantic coordinate indicative of the type of road intersection;

generating, based at least in part on the set of values, the sequence defined based at least in part on the linear temporal logic, and the semantic coordinate, the simulated scenario for execution; and determining, based at least in part on executing the simulated scenario, outcome data indicating a response by an autonomous controller to the simulated scenario.

18. The non-transitory computer-readable medium of claim 17, the operations further comprising determining to modify a behavior of the autonomous controller based at least in part on the outcome data wherein the object comprises a static object or a dynamic object.

19. The non-transitory computer-readable medium of claim 17, wherein the object is associated with at least one of a body comprising a defined dimension, a pose, or a mesh to render the object in the simulated scenario.

20. The non-transitory computer-readable medium of claim 17, wherein the outcome data is based at least in part on an evaluation of the linear temporal logic.

* * * * *